(12) United States Patent  
Hirano

(10) Patent No.: US 6,608,782 B2
(45) Date of Patent: Aug. 19, 2003

(54) BOOSTER CIRCUIT CAPABLE OF ACHIEVING A STABLE PUMP OPERATION FOR NONVOLATILE SEMICONDUCTOR MEMORY DEVICE

(75) Inventor: Yasuaki Hirano, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/083,408

(22) Filed: Feb. 27, 2002

(65) Prior Publication Data

US 2002/0159290 A1 Oct. 31, 2002

(30) Foreign Application Priority Data

Feb. 28, 2001 (JP) ........................................ 2001-054264

(51) Int. Cl.[7] ................................................ G11C 7/00
(52) U.S. Cl. .......................... 365/189.09; 365/185.23; 365/226; 327/536
(58) Field of Search ................... 365/185.18, 185.17, 365/185.29, 185.25, 185.23, 189.09, 226, 149; 327/536, 535, 534, 540, 541, 538

(56) References Cited

U.S. PATENT DOCUMENTS

| | | | |
|---|---|---|---|
| 4,970,409 A | * 11/1990 | Wada et al. | ................. 327/541 |
| 5,315,547 A | * 5/1994 | Shoji et al. | ............. 365/185.12 |
| 5,440,509 A | * 8/1995 | Momodomi et al. | ... 365/185.13 |
| 5,675,279 A | * 10/1997 | Fujimoto et al. | ............. 327/536 |
| 6,157,242 A | * 12/2000 | Fukui | .......................... 327/536 |
| 2003/0022411 A1 | * 1/2003 | Sumitani et al. | ............... 438/48 |

* cited by examiner

*Primary Examiner*—Hoai Ho
*Assistant Examiner*—Gene N. Auduong
(74) *Attorney, Agent, or Firm*—Morrison & Foerster LLP

(57) ABSTRACT

A p-MOS transistor 38 is connected to an intermediate node 5. A level shifter 39 supplies an output signal hresetb to a gate of the p-MOS transistor 38 based on a signal Reset. Then, in an initial state until a pump operation is started, the signal Reset is set at "H" to turn on the p-MOS transistor 38. Thus, a positive charge of the intermediate node 5 is discharged via the p-MOS transistor 38 and a negative charge is discharged via an N-well of the p-MOS transistor 38 so that the potential of the intermediate node 5 becomes about 0.7 V. Therefore, even when the pump operation is started and the p-MOS transistor 38 is turned off, the maximum voltage applied to each of the capacitors C4*a*, C4*b* is 4 V, and exceeding of the withstand voltage of a capacitor insulating film can be prevented.

6 Claims, 14 Drawing Sheets

Fig. 20A BACKGROUND ART
Fig. 20B BACKGROUND ART
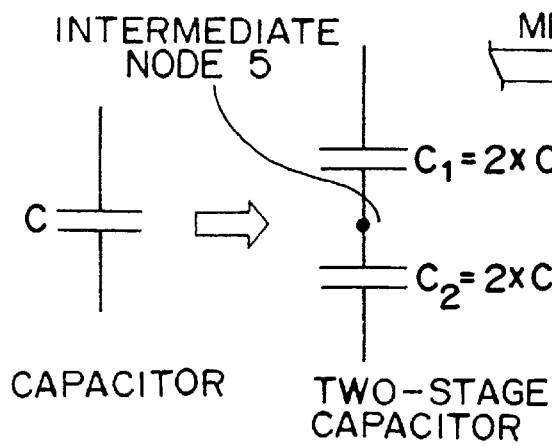
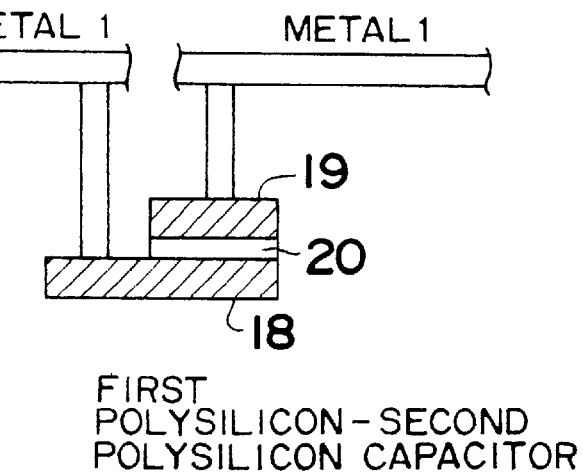
Fig. 21 BACKGROUND ART
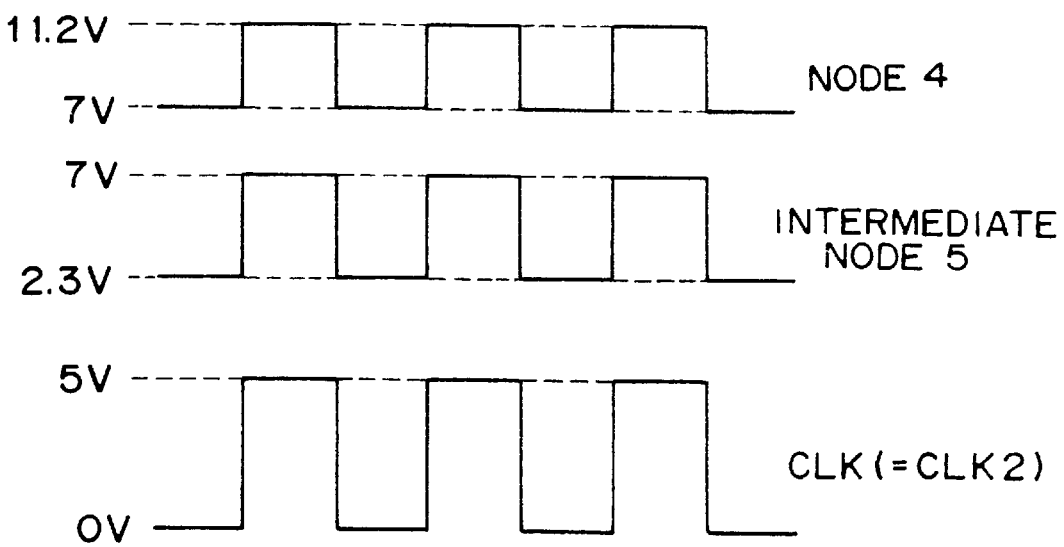

BOOSTER CIRCUIT CAPABLE OF ACHIEVING A STABLE PUMP OPERATION FOR NONVOLATILE SEMICONDUCTOR MEMORY DEVICE

BACKGROUND OF THE INVENTION

The present invention relates to a booster circuit for a nonvolatile semiconductor memory device, in particular, a booster circuit having a capacitor made of a dielectric film.

Conventionally, the most widely used flash memories (batch erase type memory) include ETOX (EPROM Thin Oxide: a registered trademark of Intel). FIG. 11 shows a schematic cross sectional view of this ETOX-type flash memory cell. As shown in FIG. 11, a floating gate 5 is formed on a source 1, a drain 2 and a substrate (well) 3 between the source and the drain via a tunnel oxide film 4. Furthermore, a control gate 7 is formed on the floating gate 5 via an interlayer insulating film 6.

The operation principles of the ETOX-type flash memory are explained below. As shown in Table 1, a voltage Vpp (for example, 9 V) is applied to the control gate 7, a standard voltage Vss (for example, 0 V) is applied to the source 1 and a voltage of 6 V is applied to the drain 2 during a write operation. Consequently, a large amount of currents flow into a channel layer, channel hot electrons are generated in a portion on the drain 2 side having a high electric field and electrons are injected into the floating gate 5. As a result, the threshold voltage of a memory cell 8 is increased and data is written to the memory cell 8. FIG. 12 shows a threshold voltage distribution in a written state and an erased state. As shown in FIG. 12, the threshold voltage of the written memory cell is 5 V or higher.

TABLE 1

|  | Control gate 7 | Drain 2 | Source 1 | Substrate 3 |
| --- | --- | --- | --- | --- |
| Write | 9 V | 6 V/0 V | 0 V | 0 V |
| Erase | −7.5 V | Open | 4 V | 0 V |
| Read | 5 V | 1 V | 0 V | 0 V |

Furthermore, during an erase operation, a voltage Vnn (for example, −7.5 V) is applied to the control gate 7 and a voltage Vpe (for example, 4 V) is applied to the source 1. Consequently, the drain 2 is opened, and a strong electric field is generated in the tunnel oxide film 4 between the source 1 and the floating gate 5. Then, electrons are pulled from the floating gate 5 to the source 1 side by Fowler-Nordheim (FN) tunneling to decrease the threshold voltage of the memory cell 8. As a result, the threshold voltage of the erased memory cell 8 becomes 1.5 to 3 V as shown in FIG. 12.

Furthermore, during a read operation, a voltage of 1 V is applied to the drain 2 and a voltage of 5 V is applied to the control gate 7. Here, when the memory cell 8 is in an erased state and has a low threshold voltage, currents flow into the memory cell 8 and a state "1" is determined. On the other hand, when the memory cell 8 is in a written state and has a high threshold voltage, currents do not flow into the memory cell and a state "0" is determined.

Meanwhile, when a nonvolatile semiconductor memory device using the ETOX-type flash memory cell or the like is driven, for example, in a case where an external power source voltage Vcc is 5 V, voltages other than the externally supplied power source voltage Vcc (5 V) (in the above example, voltages Vpp, Vnn and the like) are required in a drive system of the nonvolatile semiconductor memory device. FIG. 13 shows a block diagram of a voltage generation system in this case.

As shown in FIG. 13, three booster circuits (voltage pumps) are provided in the voltage generation system of the nonvolatile semiconductor memory device. One is a first high voltage pump 14. This first high voltage pump 14 generates a bit line voltage and transmits it to a Y decoder 12 during a write operation to respective memory cells 8 constituting a memory cell array 11. Meanwhile, during an erase operation, the pump generates a source voltage and transmits it to a source switch circuit 13 to apply the voltage to the source 1 of the memory cell 8. It is noted that an output voltage of the first high voltage pump 14 is lowered to 4 V during the erase operation. Another pump is a second high voltage pump 16, which generates a word line voltage during a write operation and transmits it to an X decoder 15. The other pump is a negative voltage pump 17, which generates a negative voltage for a word line (control gate 7) during an erase operation and transmits it to the X decoder 15.

The outputs of the first high voltage pump 14 and the second high voltage pump 16 are used as power sources for a level shifter circuit or the like in the Y decoder 12 and the source switch circuit 13. Table 2 shows values of maximum voltages outputted from the voltage pumps 14, 16, 17.

TABLE 2

|  | Voltage |
| --- | --- |
| First high voltage pump 14 | 6 V |
| Second high voltage pump 16 | 9 V |
| Negative voltage pump 17 | −7.5 V |

FIG. 14 shows an example of these voltage pumps generating voltages. FIG. 14 is a circuit diagram of the second high voltage pump 16, which is constituted by a plurality of n-MOS (metal oxide film semiconductor) transistors and a plurality of capacitors. An external power source voltage Vcc is boosted by inputting a clock CLK to output a higher voltage. FIG. 15 shows changes in the voltage of each node with time in this case (for example, in the case of Vcc=5 V). The voltage of each node in FIG. 15 is an average voltage value. Although it is not shown, the voltage is actually amplified in synchronization with the clock CLK. As shown in FIG. 15, the voltage of each node is gradually increased with time and reaches a prescribed voltage for each node. It is noted that the output voltage of the second high voltage pump 16 in this case is 9 V (not shown).

FIG. 16 shows details of a voltage waveform immediately after the voltage of node 4 is increased and reaches the prescribed voltage 11.2 V, that is, a voltage waveform at the encircled point in FIG. 15. As shown in FIG. 16, when the clock CLK2 of Vss is inputted into the capacitor C4 ((0 V)→Vcc (5 V)), the voltage of the node 4 is increased from 7 V to 11.2 V. As a result, a voltage of 9 V on average can be obtained at the output stage. This output voltage of 9 V finally becomes a word line voltage during a write operation.

FIG. 17 shows a circuit of the negative voltage pump 17. It has a basic constitution that is similar to that of the second high voltage pump 16 and is constituted by a plurality of p-MOS transistors and a plurality of capacitors. Furthermore, an external voltage Vss is lowered by inputting a clock CLK to output a negative voltage. FIG. 18 shows changes of the voltage of each node with time in this case.

The voltage of each node changes with time and reaches a prescribed voltage for each node. FIG. 19 shows details of a voltage waveform at the encircled point in FIG. 18. As shown in FIG. 19, when the clock CLK2 (Vcc (5 V)→Vss (0 V)) is inputted into the capacitor C4, the voltage of the node 4 is lowered from −5.8 V to −9.8 V. As a result, a voltage of about −7.5 V on average can be obtained at the output stage. This output voltage of −7.5 V finally becomes a gate line voltage during an erase operation.

However, the above conventional booster circuit of a nonvolatile semiconductor memory device has the following problems. That is, in the case of the second high voltage pump 16 having a configuration shown in FIG. 14, the voltage of the node 4 is 7 V when the clock CLK2 is 0 V, while it is 11.2 V when the clock CLK2 is 5 V. Therefore, the voltage applied to the capacitor C4 becomes 7 V when the clock CLK2 is 0 V, while it is 6.2 V when the clock CLK2 is 5 V. Here, when the withstand voltage of an insulating film constituting a dielectric film of the capacitor C4 is 6.5 V, a voltage applied when the clock CLK2 is 0 V, which is 7 V, exceeds the withstand voltage. Therefore, the insulating film may be damaged in the worst case.

As one of methods for solving this problem, in a semiconductor integrated circuit disclosed in Japanese Patent Laid-Open Publication No. 5-28786, a thick oxide film is used as a dielectric film for a capacitor that is disposed in the vicinity of the output stage and subjected to a large potential difference between its ends to avoid the above problem of the withstand voltage.

Furthermore, as one of other methods, as shown in FIG. 20A, there is a method wherein a capacitor C is constituted by a two-stage capacitor composed of two capacitors $C_1$, $C_2$ connected in series and a voltage applied to each capacitor $C_1$, $C_2$ is decreased. Here, when a capacity of each of the two-staged capacitors $C_1$, $C_2$ is "2×C", the capacity of the capacitors $C_1$, $C_2$ becomes "C" when they are two-staged in series.

When this method is applied to the capacitor C4 in FIG. 14 and the node 5 between the two-stage capacitors $C_1$, $C_2$ is an intermediate node, voltage waveforms of the clock CLK2, the node 4 and the intermediate node 5 are ideally as shown in FIG. 21. That is, in FIG. 21, when the voltage of the clock CLK2 is 0 V, the voltage of the intermediate node 5 is 2.3 V, the voltage of the node 4 is 7 V and the maximum applied voltage is 4.7 V. On the other hand, the voltage of the clock CLK2 is 5 V, the voltage of the intermediate node 5 is 7 V, the voltage of the node 4 is 11.2 V and the maximum applied voltage is 4.2 V. Therefore, the maximum voltage applied to each capacitor $C_1$, $C_2$ is 4.7 V and can be suppressed to the aforementioned withstand voltage 6.5 V of the capacitor or lower.

Meanwhile, as shown in FIG. 20B, when one capacitor is achieved by a laminated structure wherein an interlayer insulating film 20 is sandwiched between a first polysilicon film 18 and a second polysilicon film 19 (in practice, when an interlayer insulating film of the memory cell array 11 (see FIG. 11) is formed, a capacitor of a booster circuit is often formed by the same polysilicon film/insulating film/polysilicon film), the intermediate node 5 is in a floating state, thereby receiving no direct potential from other nodes. As a result, the intermediate node 5 is charged up in the initial state, the positive charge can be charged up to, for example, 5 V. The relationship between the voltage transition of the clock CLK2 and the voltage transitions of the node 4 and the intermediate node 5 in this case is shown in FIG. 22. As shown in FIG. 22, the maximum voltage applied to the capacitor $C_2$ becomes 7.3 V and exceeds the withstand voltage of the capacitor insulating film composed of an interlayer insulating film 20. Therefore, the capacitor is damaged in the worst case.

On the other hand, when the negative charge can be charged up to, for example, −5 V in the initial state, the relationship of the voltage transition of the clock CLK2 and the voltage transitions of the node 4 and the intermediate node 5 in this case is as shown in FIG. 23. As shown in FIG. 23, the maximum voltage applied to the capacitor $C_1$ becomes 9.7 V and exceeds the withstand voltage of the capacitor insulating film composed of the interlayer insulating film 20. Therefore, the capacitor is damaged in the worst case.

Thus, in the above two-stage capacitor, when the intermediate node is in a floating state, the intermediate node is charged up and either one of the voltages of the both ends of the capacitor may exceed the withstand voltage of the capacitor insulating film. Thus, a problem arises that the insulating film constituting the capacitor may be damaged.

Therefore, as a method for solving this problem in the two-stage capacitor, there is a method wherein a diode is connected to the intermediate node of the two-stage capacitor (in practice, a transistor connected as a diode). For example, as shown in FIG. 24, an n-MOS transistor 21 is connected to an intermediate node 5 between two capacitors C4a, C4b constituting a two-stage capacitor. In this case, when the intermediate node 5 is almost charged to a negative voltage, the charge is discharged into an n-diffusion region or a p-well of the n-MOS transistor, thereby causing no problem. Furthermore, since the intermediate node 5 has a positive potential during an operation, there is no problem. However, when the intermediate node 5 is charged up to a positive charge, there is basically no path to which the charge is discharged and it leads to the situation shown in FIG. 22 in the worst case. Since the voltage applied to the capacitor C4b exceeds the withstand voltage, the capacitor C4b is damaged in the worst case.

Furthermore, as shown in FIG. 25, a p-MOS transistor 22 may be connected to the intermediate node 5 between the two capacitors C4a, C4b constituting a two-stage capacitor. In this case as well, the situation shown in FIG. 22 is basically caused as in the case of FIG. 24, and damage to the capacitor due to a charge-up to a positive charge cannot be avoided.

Furthermore, the negative voltage pump 17 having a configuration shown in FIG. 17 also has the same problem as that of the second high voltage pump 16. That is, a large voltage difference of 10.8 V in maximum is applied to a part of the capacitor C4 in the vicinity of the output stage, wherein the lowest voltage is outputted, as shown in FIG. 19. Here, when the capacitor withstand voltage is 8 V, the capacitor withstand voltage is exceeded and the capacitor C4 is damaged.

Therefore, as in the case of the above high voltage pump, a method wherein the capacitor C4 is two-staged is used to avoid an excess voltage. The circuit configuration is shown in FIG. 26. As shown in FIG. 26, the capacitor connected to the node 4, which has the largest voltage difference, is constituted by two stages. The voltage waveform in this case is ideally as shown in FIG. 27. In this case, the maximum voltage applied to both ends of the capacitor is 6.4 V, which is not higher than the withstand voltage.

However, when a circuit configuration as shown in FIG. 26 is used and the two-stage capacitor C4a, C4b is formed by a "polysilicon film/insulating film/polysilicon film", the intermediate node 5 becomes in a floating state and this intermediate node 5 may be charged up. Furthermore, when a negative charge is charged up to this intermediate node 5 in the initial state, voltage waveforms are obtained as shown in FIG. 28. When a positive charge is charged up, voltage waveforms become as shown in FIG. 29. In either case, the withstand voltage of the capacitor, which is 8 V, may be exceeded. Therefore, a problem arises that the capacitor may be damaged.

SUMMARY OF THE INVENTION

Accordingly, the object of the present invention is to provide a booster circuit of a nonvolatile semiconductor memory device wherein a stable pump operation can be achieved without charging up an intermediate node between two-stage capacitors.

In order to achieve the above object, there is provided a booster circuit of a nonvolatile semiconductor memory device having a plurality of capacitors, generating a voltage different from a power source voltage during a write operation and an erase operation and supplying the voltage to the nonvolatile semiconductor memory device, wherein among those capacitors, a capacitor to which a high electric field exceeding a withstand voltage of an insulating film constituting each capacitor is applied is constituted by two or more partial capacitors connected to each other in series; the booster circuit, comprising:

a transistor element connected between the partial capacitors; and control means, which turns on the transistor element when the nonvolatile semiconductor memory device is in an inoperative state and turns off the transistor element when the device is in an operative state.

According to the above constitution, when the nonvolatile semiconductor memory device is in an inoperative state, a transistor element connected between the partial capacitors constituting a capacitor to which a high electric field is applied is turned on by a control means. Thus, the charge charged to the intermediate node between the partial capacitors is discharged via the transistor element, which is turned on. Therefore, a voltage applied to each capacitor and each partial capacitor during a normal operation does not exceed its withstand voltage and an insulating film constituting the capacitor and the partial capacitors is not damaged.

Furthermore, when an operation of the nonvolatile semiconductor memory device is started, the transistor element is turned off by the control means. Therefore, a stable operation can be performed when the operation of the nonvolatile semiconductor memory device is started.

In one embodiment of the present invention, the transistor element is a p-type metal oxide film semiconductor transistor whose source is connected to a standard voltage; and the control means is constituted such that the standard voltage is applied to a gate of the p-type metal oxide film semiconductor transistor when the nonvolatile semiconductor memory device is in an inoperative state.

According to this embodiment, when a positive charge is charged to the intermediate node between the partial capacitors, the charge is discharged via a turned-on p-type MOS transistor. On the other hand, a negative charge is charged, the charge is discharged via an N-well of the p-type MOS transistor. Thus, the potential of the intermediate node becomes about 0.7 V. Therefore, the voltage applied to each partial capacitor does not exceed the withstand voltage during a normal operation.

In one embodiment of the present invention, the transistor element is an n-type metal oxide film semiconductor transistor whose source is connected to the standard voltage; and the control means is constituted such that the power source voltage is applied to a gate of the n-type metal oxide film semiconductor transistor when the nonvolatile semiconductor memory device is in an inoperative state.

According to this embodiment, a positive or negative charge charged to the intermediate node between the partial capacitors is discharged via the turned-on p-type MOS transistor. Thus, the potential of the intermediate node is maintained at the standard voltage and not charged up. Therefore, the voltage applied to each partial capacitor during a normal operation does not exceed the withstand voltage and the capacitor cannot be charged up.

In one embodiment of the present invention, at least the partial capacitor has a structure including polysilicon, an insulating film and polysilicon laminated in this order.

According to this embodiment, since each of the partial capacitors constituting a multiple-stage capacitor has a stacked structure of polysilicon/insulating film/polysilicon, the intermediate node becomes in a floating state and is easily charged up. However, since the charge of the intermediate node is discharged via the turned-on transistor element, the voltage applied to each partial capacitor during a normal operation does not exceed the withstand voltage.

In one embodiment of the present invention, the voltage different from the power source voltage is a high voltage higher than the power source voltage.

According to this embodiment, the intermediate node between the multiple-stage capacitors is not charged up and a stably operatable booster circuit for a high voltage can be obtained.

In one embodiment of the present invention, the voltage different from the power source voltage is a negative voltage.

According to this embodiment, the intermediate node between the multiple-stage capacitors is not charged up and a stably operatable booster circuit for a negative voltage can be obtained.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 20 is a view for explaining a two-stage capacitor;

FIG. 21 shows an ideal voltage waveform of the intermediate node when the two-stage capacitor is applied to a high voltage pump;

DETAILED DESCRIPTION OF THE PREFERRED EMBODIMENTS

Hereafter, embodiments of the present invention are explained in detail with reference to the accompanying drawings.

(First Embodiment)

Figure 1:
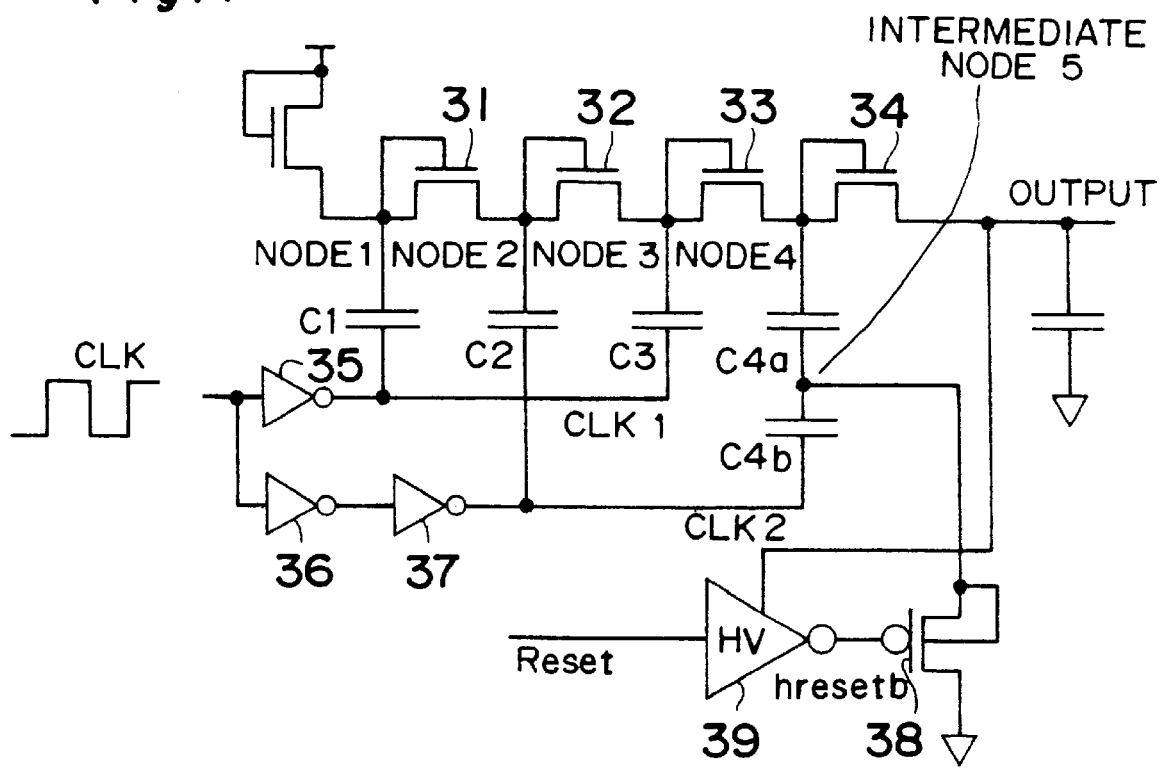
FIG. 1 is a circuit diagram of a booster circuit of a nonvolatile semiconductor memory device according to the present invention.
Figure 14:
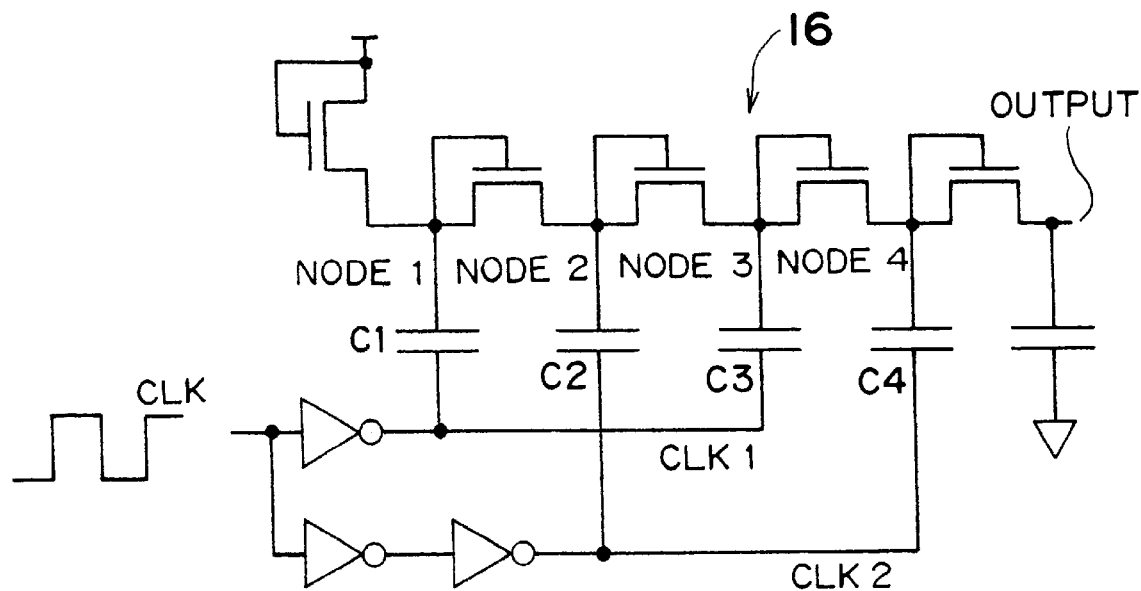
FIG. 14 is a circuit diagram of a conventional high voltage pump in FIG. 13.

FIG. 1 is a circuit diagram of a booster circuit for a nonvolatile semiconductor memory device according to this embodiment. This booster circuit has the same basic configuration as that of the second high voltage pump 16 shown in FIG. 14. That is, this booster circuit is substantially constituted by four n-MOS transistors 31 to 34 whose gates are connected to the drain side and which are connected in series, three capacitors C1 to C3 whose one electrodes are connected to nodes 1 to 3, that is, drains of the n-MOS transistors 31 to 33, and a two-stage capacitor composed of capacitors C4a, C4b, which are connected to a node 4, that is, a drain of the n-MOS transistor 34, and are connected to each other in series.

A clock CLK is inputted to the other electrodes of the capacitors C1, C3 via an inverter 35 as a clock CLK1. Furthermore, a clock CLK is inputted to the other electrodes of the capacitors C2, C4b via inverters 36, 37 as a clock CLK2.

Figure 2:
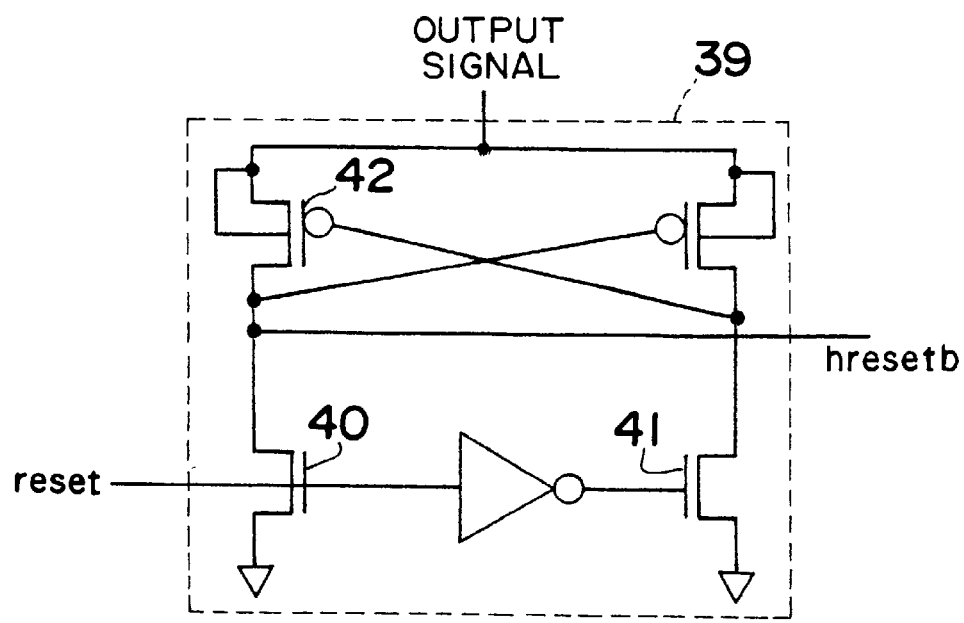
FIG. 2 shows a circuit configuration of a level shifter in FIG. 1.

In this embodiment, a drain of a p-MOS transistor 38 is connected to an intermediate node 5 between the two capacitors C4a, C4b constituting a two-stage capacitor. Furthermore, a gate of the p-MOS transistor 38 is controlled by a level shifter 39. This level shifter 39 is a conventional high voltage level shifter having a circuit configuration shown in FIG. 2.

Figure 3:
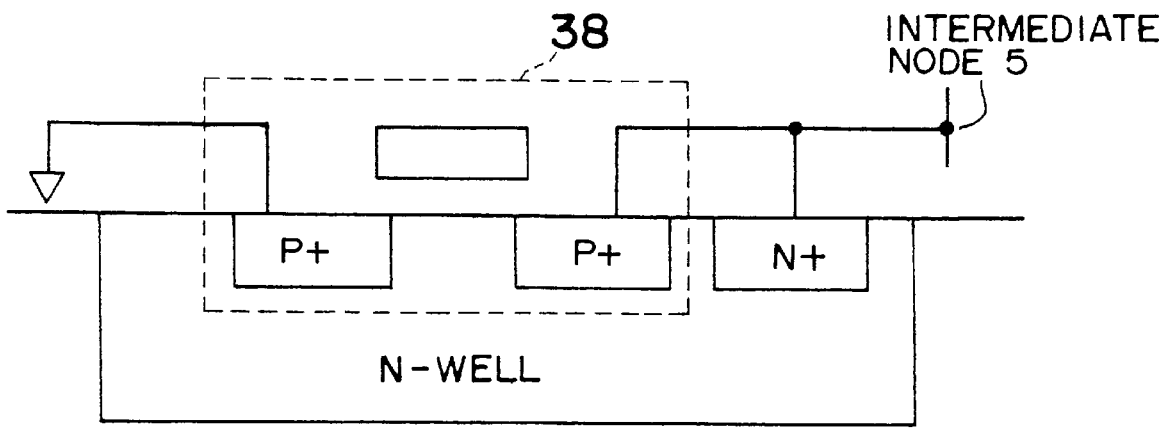
FIG. 3 is a view for explaining a discharge path with respect to an intermediate node in FIG. 1.

The booster circuit having the above configuration operates as follows. That is, until a pump operation is started, a signal Reset to the level shifter 39 is maintained in an "H" state. In this case, since an n-MOS transistor 40 of the level shifter 39 (see FIG. 2) is turned on, a signal hresetb in an "L (Vss)" state is outputted and the p-MOS transistor 38 is turned on. Therefore, when a positive charge is charged to the intermediate node 5 between the capacitors C4a, C4b constituting a two-stage capacitor, this positive charge is discharged via the p-MOS transistor 38. On the other hand, when a negative charge is charged, this negative charge is discharged from the N-well as shown in FIG. 3 and a potential of the intermediate node 5 falls in a range of −0.6 V to 0.7 V even in the worst case. Thus, the potential of the intermediate node 5 is usually about 0.7 V.

When a pump operation is started in this state, the level of the signal Reset to the level shifter 39 becomes "L". In this case, since an n-MOS transistor 41 (see FIG. 2) of the level shifter 39 is turned on, a p-MOS transistor 42 is turned on, an output voltage of this booster circuit is outputted as the signal hresetb and the p-MOS transistor 38 is turned off. Therefore, when the clock CLK is inputted (0 V→V cc (5 V)) immediately after the start of the pump operation, the voltage of the intermediate node 5 is increased to about 3.2 V (the above positive charge charged in the initial state remains and is about 0.7 V). In this case, since the n-MOS transistor 34 is already turned off, the voltage of the intermediate node 5, which is 3.2 V, is maintained and, as a result, the potential of the node 4 is raised. Thus, a stable operation can be performed when the pump operation is started.

Figure 15:
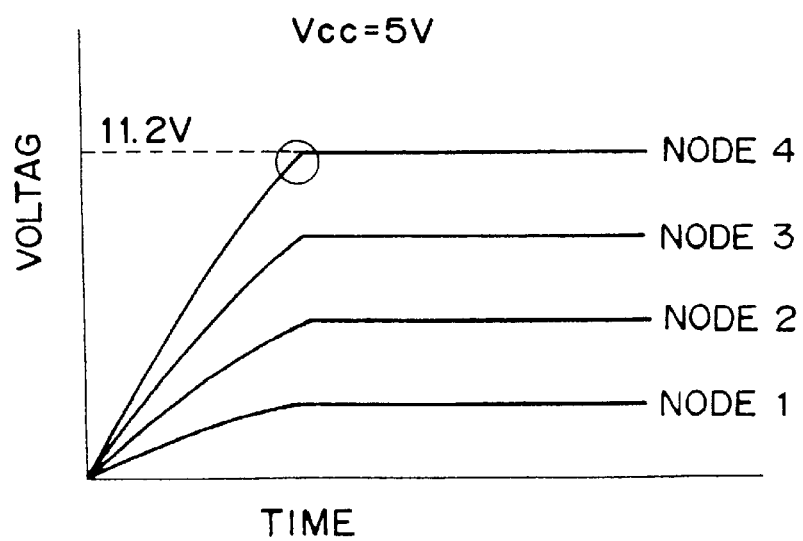
FIG. 15 shows voltage changes in each node with time in the high voltage pump shown in FIG. 14.
Figure 16:
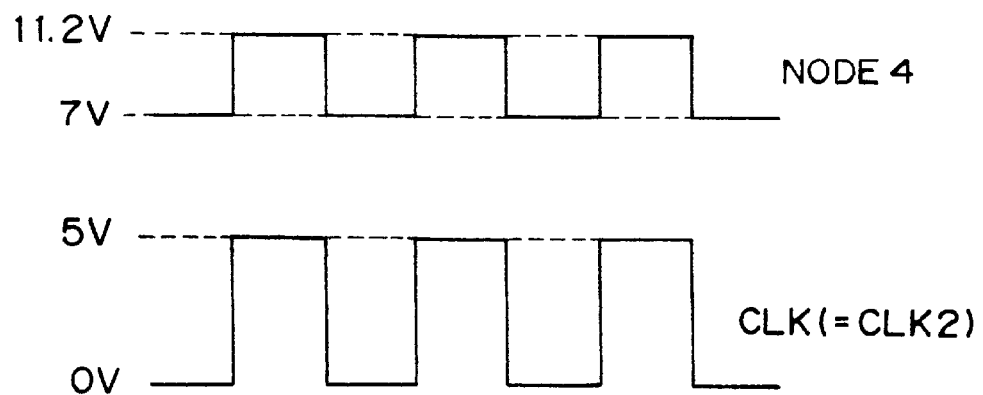
FIG. 16 shows voltage waveforms of a node 4 at the encircled point in FIG. 15.
Figure 17:
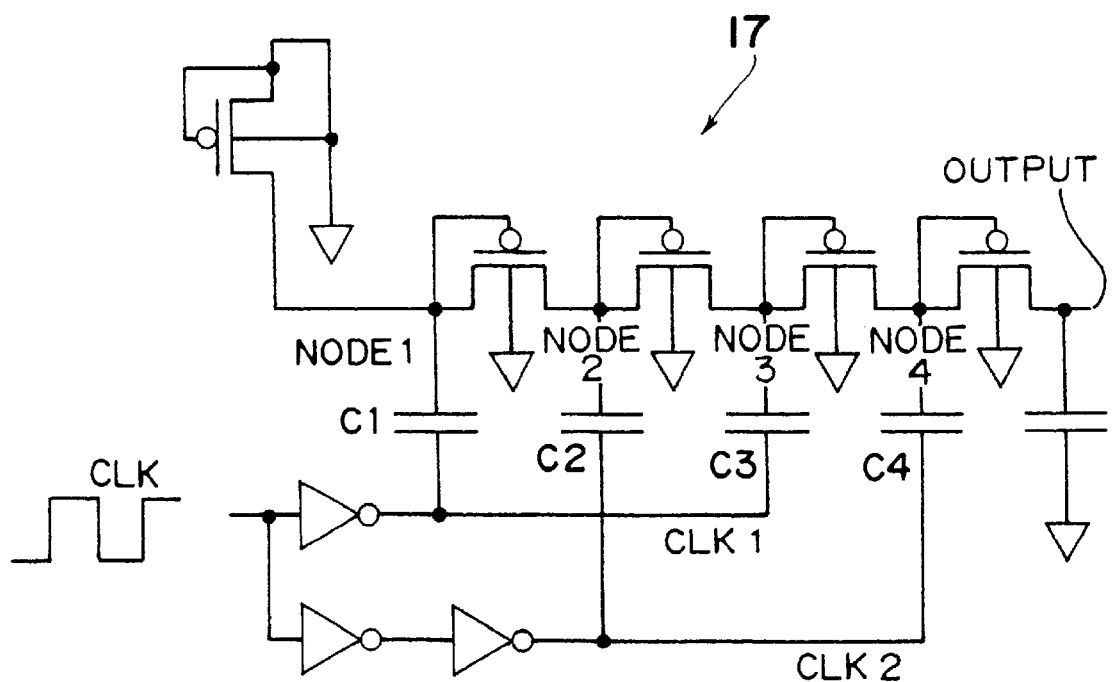
FIG. 17 is a circuit diagram of a conventional negative voltage pump in FIG. 13.

Here, in the case of an ideal state, where the internal voltage of this booster circuit is 0 V at the initial state, when the average voltage of the nodes 1, 2, 3, 4 is Vcc=5V, the voltage waveform rises with time as shown in FIG. 15. After the output becomes stable, voltage waveforms of the nodes 4, 5 become as shown in FIG. 21.

Figure 4:
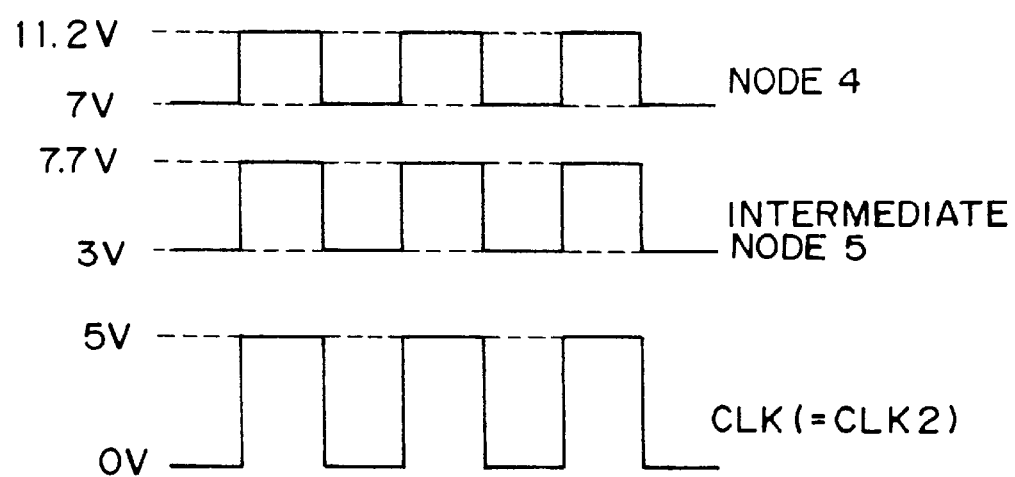
FIG. 4 shows voltage waveforms of nodes 4, 5 in FIG. 1 after an output becomes stable.

However, since the initial voltage is about 0.7 V higher when the internal voltage of this booster circuit rises about 0.7 V, the voltage waveforms of the nodes 4, 5 after the output becomes stable become as shown in FIG. 4. This suggests that the potential of the intermediate node 5 in this case is about 0.7 V higher than in the case of the ideal state in FIG. 21. This means that, when the internal voltage is 0.7 V or higher, the potential of the intermediate node 5 in a stable state also becomes 0.7 V higher than in the case of the ideal state.

However, in the booster circuit of this embodiment, even if a positive charge or a negative charge is charged to the intermediate node 5 in the initial state until the pump operation is started, the node is discharged by operations of the level shifter 39 and the p-MOS transistor 38. Therefore, even if the potential of the intermediate node 5 is charged up in the initial state, it is at most about 0.7 V and the waveforms of the nodes 4, 5 become as shown in FIG. 4.

In this case, the maximum voltage applied to the capacitors C4a, C4b constituting a two-stage capacitor is 4 V as shown in FIG. 4. Here, since the withstand voltage of the capacitor is 6.5 V, voltages applied to both ends of the capacitors C4a, C4b do not exceed the withstand voltage of the capacitor insulating film. As a result, a stable operation can be performed when the pump operation is started and a voltage applied to a capacitor does not exceed the withstand voltage of the capacitor during a normal operation. Thus, damage to the capacitor insulating film can be prevented.

As described above, the booster circuit in this embodiment is constituted by a plurality of n-MOS transistors 31 to 34 and a plurality of capacitors C1 to C4, while the capacitor C4 at the final stage is constituted by a two-stage capacitor composed of capacitors C4a, C4b. Furthermore, a drain of a p-MOS transistor 38 is connected to the intermediate node 5 between the capacitors C4a, C4b and an output terminal of a level shifter 39 is connected to a gate of the p-MOS transistor 38. Furthermore, accumulated charges of the capacitors C1 to C4, based on clock CLK are given to corresponding drains of the n-MOS transistors 31 to 34 alternately. The external power source voltage Vcc is increased to output a high voltage to be used for a word line voltage during a write operation or the like.

In this case, during the initial state until a pump operation is started, the p-MOS transistor 38 is turned on by setting the level of a signal Reset to the level shifter 39 to be "H". Therefore, when a positive charge is charged to the intermediate node 5, the node is discharged via the p-MOS transistor 38, while, when a negative charge is charged, the node is discharged via an N-well of the p-MOS transistor 38. Thus, the potential of the intermediate node 5 can be made about 0.7 V.

Therefore, the waveforms of the nodes 4, 5 become as shown in FIG. 4 even when a pump operation is started, the level of the signal Reset becomes "" and the p-MOS transistor 38 is turned off. That is, the maximum voltage applied to the capacitors C4a, C4b constituting a two-stage capacitor is made 4 V and thus exceeding of the withstand voltage of the capacitor insulating film can be prevented.

(Second Embodiment)

As described above, in the above first embodiment, wherein the drain of the p-MOS transistor 38 is connected to the intermediate node 5 between the two-stage capacitors C4a, C4b at the final stage and the gate of this p-MOS transistor 38 is controlled by an output signal from the level shifter 39, it is likely that the intermediate node 5 is charged up to about −0.6 V to 0.7 V at the initial state. This embodiment solves this problem.

Figure 5:
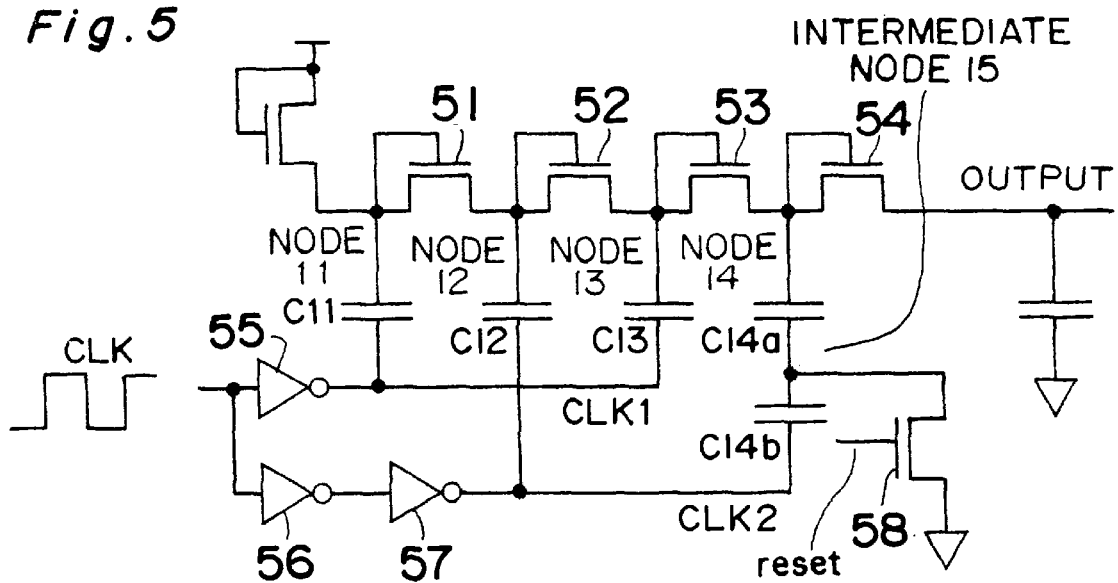
FIG. 5 is a circuit diagram of a booster circuit different from the one in FIG. 1.

FIG. 5 shows a circuit diagram of a booster circuit according to this embodiment. N-MOS transistors 51 to 54, capacitors C11 to C13, two-stage capacitors C14a, C14b and inverters 55, 56, 57 are the same as the n-MOS transistors 31 to 34, capacitors C1 to C3, two-stage capacitors C4a, C4b and inverters 35, 36, 37 in the first embodiment, respectively.

In this embodiment, a drain of an n-MOS transistor 58 is connected to an intermediate node 15 between the two capacitors C14a, C14b constituting a two-stage capacitor. Furthermore, a gate of the n-MOS transistor 58 is controlled by a signal reset.

The booster circuit having the above configuration operates as follows. That is, the level of the signal reset is maintained at "H (=Vcc)" until a pump operation is started, the n-MOS transistor 58 is turned on. Therefore, whether a positive charge or a negative charge is charged to the intermediate node 15 between the capacitors C14a, C14b constituting a two-stage capacitor, the node is rapidly discharged via the n-MOS transistor 58 and maintained at Vss (0 V). That is, the intermediate node 15 is not charged up.

When the pump operation is started in this state, the level of the signal reset becomes "L" and the n-MOS transistor 58 is turned off. Therefore, immediately after the start of the pump operation, when a level of clock CLK is changed (0 V→Vcc (5 V)), the voltage of the intermediate node 15 is increased to about 2.5 V. In this case, since the n-MOS transistor 54 is already turned off, the voltage of the intermediate node 15 is maintained at 2.5 V. As a result, the potential of the node 14 is increased.

Therefore, this booster circuit can perform a normal operation from immediately after the start of the pump operation. As in the case of FIG. 15, the average voltage of the nodes 11 to 14 is increased and reaches a prescribed voltage. Furthermore, even when the pump operation becomes stable, voltage waveforms of the nodes 14, 15 become as shown in FIG. 21 since the intermediate node 15 is not charged up during the initial operation.

In this case, the maximum voltage applied to the capacitors C14a, C14b constituting a two-stage capacitor is 4.7 V as shown in FIG. 21. Here, since the withstand voltage of the capacitor insulating film is 6.5 V, voltages applied to both ends of the capacitors C14a, C14b do not exceed the withstand voltage of the capacitor insulating film. As a result, a stable operation can be performed when the pump operation is started and a voltage applied to a capacitor does not exceed the withstand voltage of the capacitor during a normal operation. Thus, damage to the capacitor insulating film can be prevented.

As described above, in the booster circuit of this embodiment, the drain of the n-MOS transistor 58 is connected to the intermediate node 15 between the two-stage capacitors C14a, C14b at the final stage and the signal reset is inputted to the gate. Furthermore, during the initial state until the pump operation is started, the level of the signal reset is made "H" and the n-MOS transistor 58 is turned on. Therefore, the voltage of the intermediate node 15 is maintained at Vss (0 V) and is not charged up.

Therefore, waveforms of the nodes 14, 15 become ideal as shown in FIG. 21 even when the pump operation is started, the level of the signal reset becomes "L" and the n-MOS transistor 58 is turned off. That is, the maximum voltage applied to the capacitors C14a, C14b constituting a two-stage capacitor is made 4.7 V and exceeding of the withstand voltage of the capacitor insulating film can be prevented.

(Third Embodiment)

The first and second embodiments relate to a high voltage pump for generating a high voltage of 9 V. This embodiment relates to a negative voltage pump for generating a negative voltage of −7.5 V.

Figure 6:
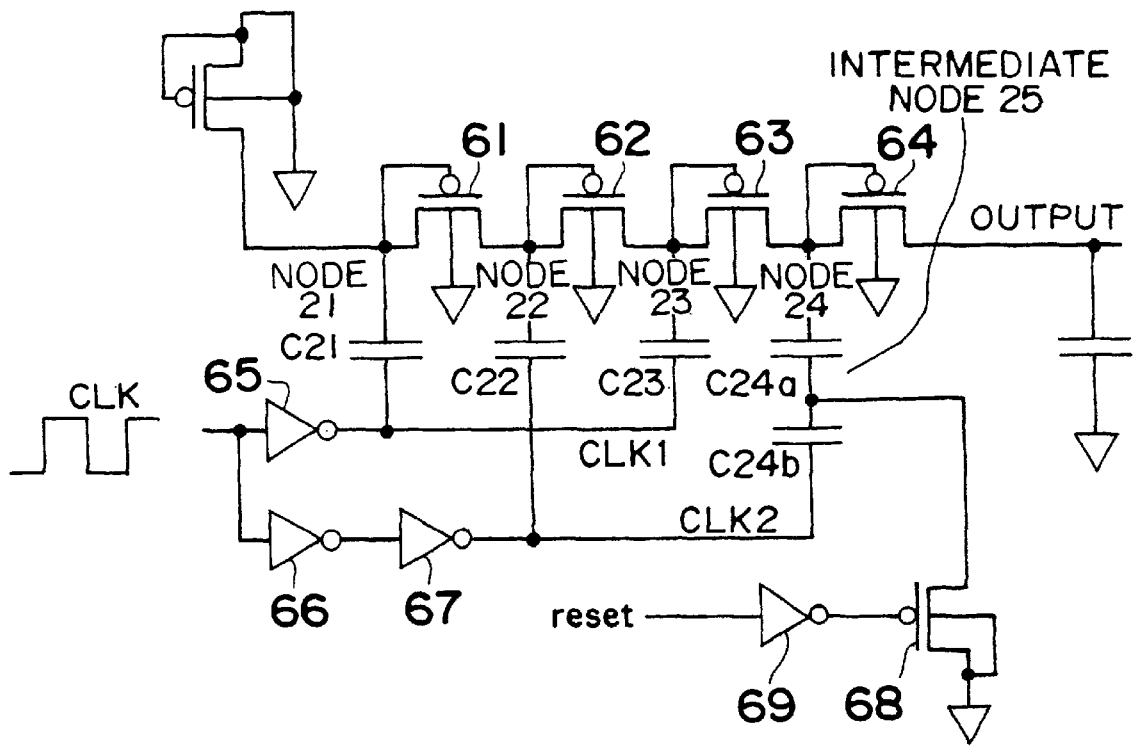
FIG. 6 is a circuit diagram of a booster circuit different from the ones in FIGS. 1 and 5.
Figure 26:
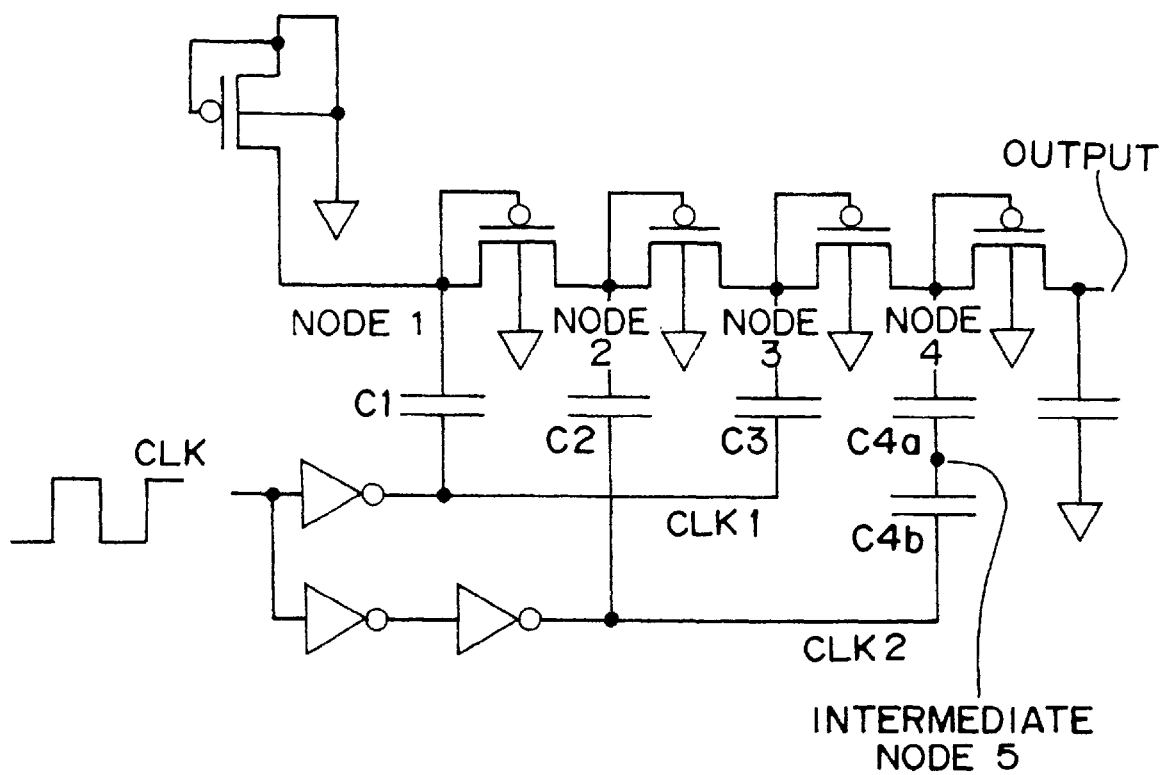
FIG. 26 is a circuit diagram of a negative voltage pump to which a two-stage capacitor is applied.

FIG. 6 shows a circuit diagram of a booster circuit of a nonvolatile semiconductor memory device according to this embodiment. This booster circuit has the same basic configuration as that of the negative voltage pump 17 shown in FIG. 26. That is, it is generally constituted by four p-MOS transistors 61 to 64, whose gates are connected to the drain side and which are connected in series, three capacitors C21 to C23, whose one electrodes are connected to nodes 21 to 23, which are drains of p-MOS transistors 61 to 63, and a two-stage capacitor composed of capacitors C24a, C24b, which are connected to a node 24, that is, the drain of the p-MOS transistor 64, and connected to each other in series.

A clock CLK is inputted to the other electrodes of the capacitors C21, C23 as a clock CLK1 via an inverter 65. Furthermore, a clock CLK is inputted to the other electrodes of the capacitors C22, C24b as a clock CLK2 via inverters 66, 67.

In this embodiment, a drain of a p-MOS transistor 68 is connected to an intermediate node 25 between the two capacitors C24a, C24b constituting a two-stage capacitor. Then, a gate of the p-MOS transistor 68 is controlled by a signal reset inputted via an inverter 69.

Figure 7:
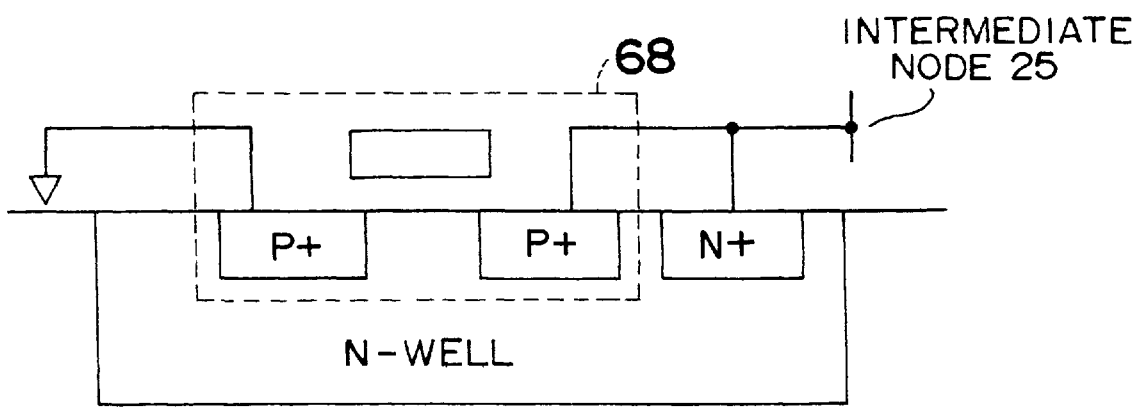
FIG. 7 is a view for explaining a discharge path with respect to an intermediate node in FIG. 6.

The booster circuit having the above configuration operates as follows. That is, since the signal reset is maintained in an "H" state until a pump operation is started, the p-MOS transistor 68 is turned on. Therefore, when a positive charge is charged to the intermediate node 25 between the capacitors C24a, C24b constituting a two-stage capacitor, this positive charge is discharged via the p-MOS transistor 68. On the other hand, when a negative charge is charged, this negative charge is discharged from an N-well as shown in FIG. 7 and a potential of the intermediate node 25 falls in a range of −0.6 V to 0.7 V even in the worst case. The potential of the intermediate node 25 is usually about 0.7 V.

When a pump operation is started in this state, the level of the signal reset becomes "L" and the p-MOS transistor 68 is turned off. Therefore, when the level of clock CLK is changed (Vcc (5 V)→0 V) immediately after the start of the pump operation, the intermediate node 25 is lowered to about −1.8 V (the above positive charge charged in the initial state remains and is about 0.7 V). In this case, since the p-MOS transistor 64 is already turned off, the voltage of the intermediate node 25 is maintained at −1.8 V and, as a result, the potential of the node 24 is lowered. Thus, a stable operation can be performed when the pump operation is started.

Figure 18:
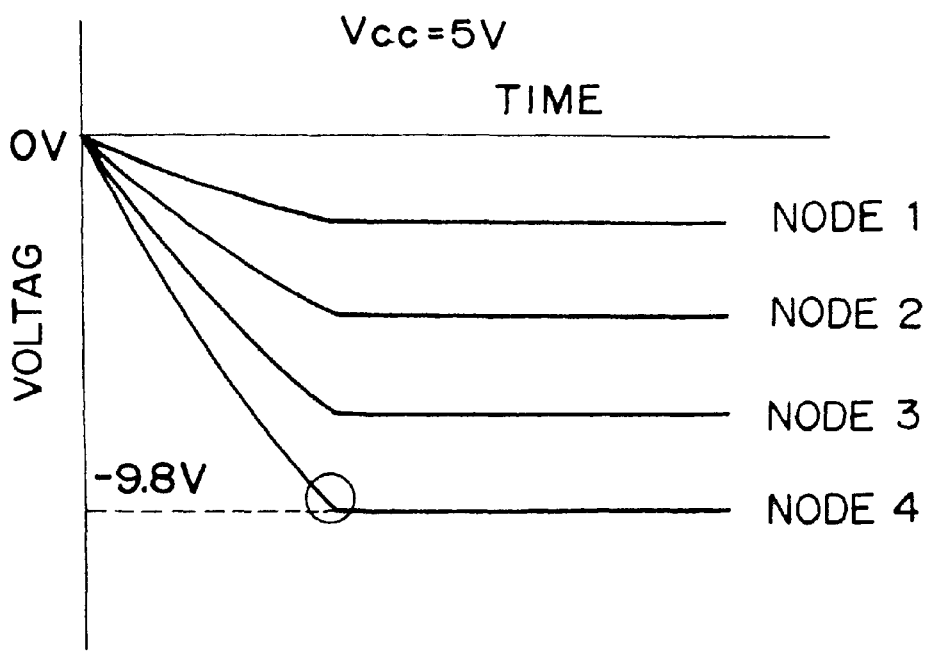
FIG. 18 shows voltage changes in each node with time in the negative voltage pump shown in FIG. 17.
Figure 19:
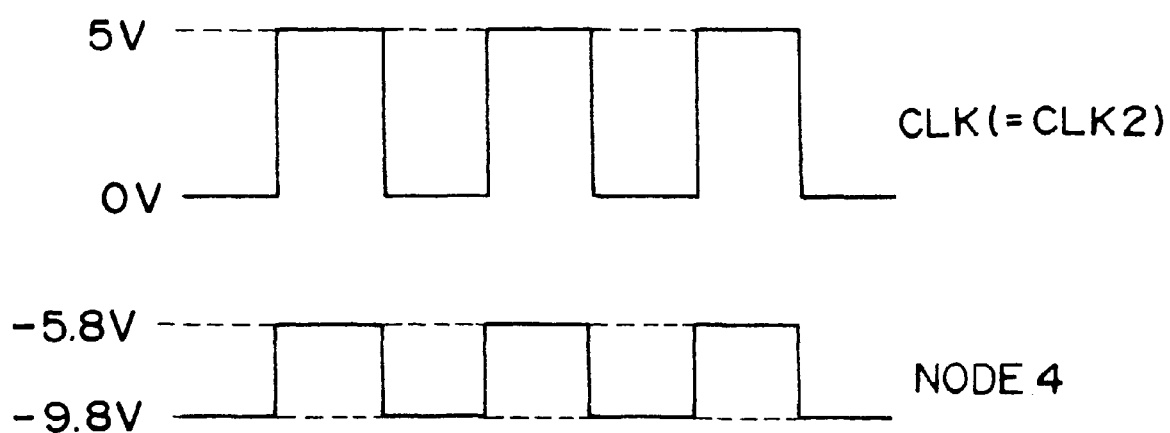
FIG. 19 shows voltage waveforms of a node 4 at the encircled point in FIG. 18.
Figure 22:
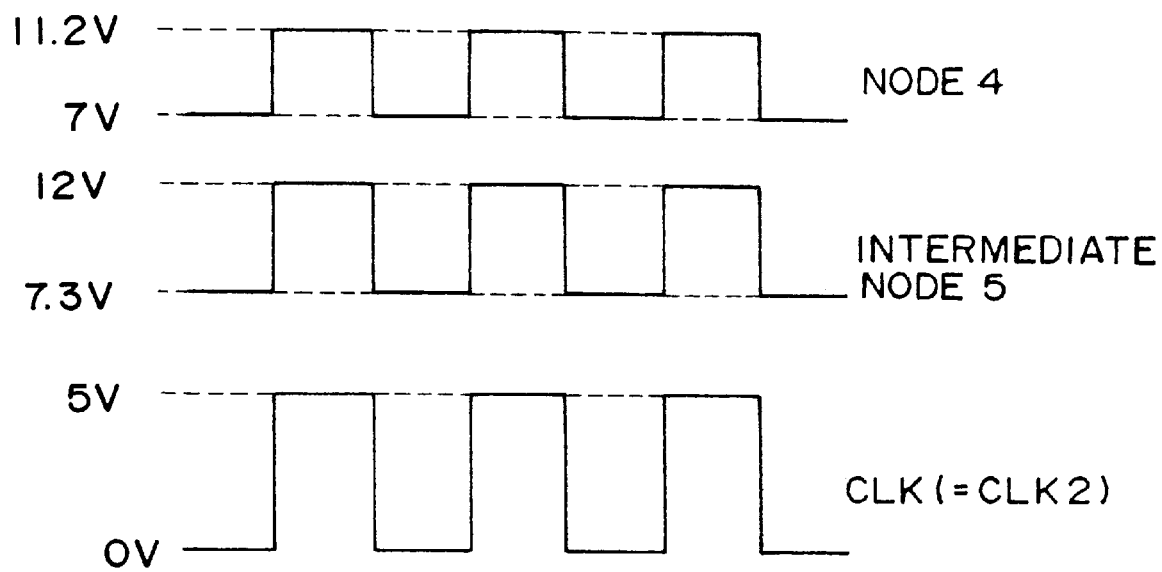
FIG. 22 shows voltage waveforms when the intermediate node is charged up to a positive voltage in the high voltage pump to which the two-stage capacitor is applied.
Figure 23:
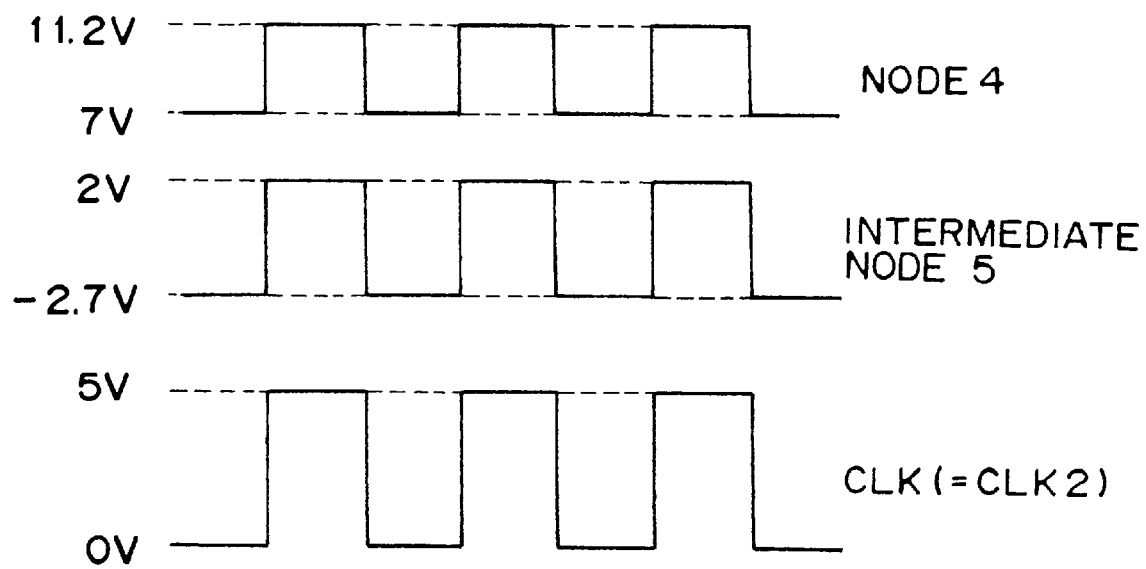
FIG. 23 shows voltage waveforms when the intermediate node is charged up to a negative voltage in the high voltage pump to which the two-stage capacitor is applied.
Figure 24:
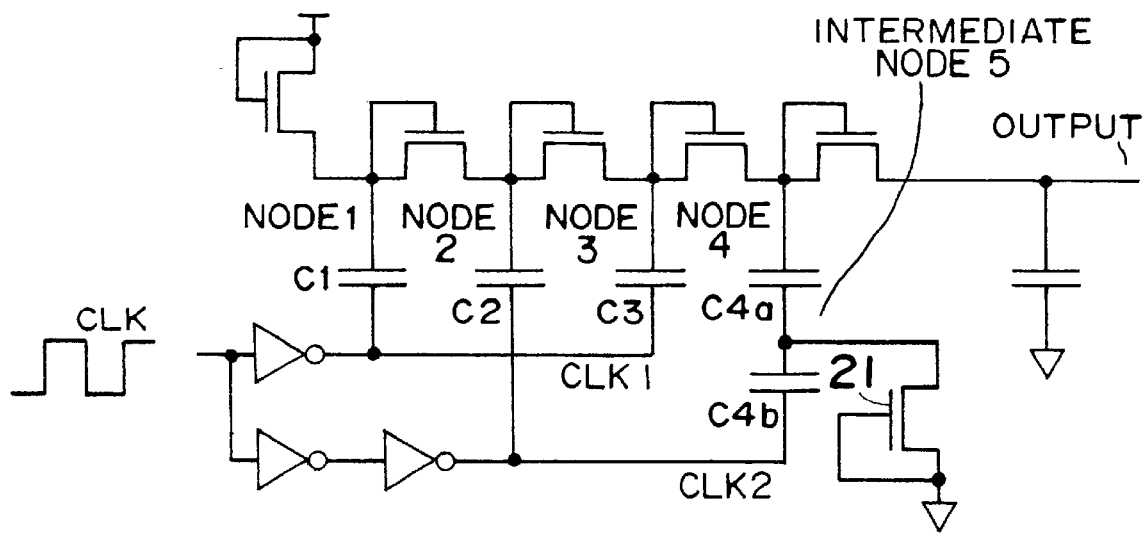
FIG. 24 is a circuit diagram of a conventional high voltage pump wherein an intermediate node between two-stage capacitors is discharged.
Figure 25:
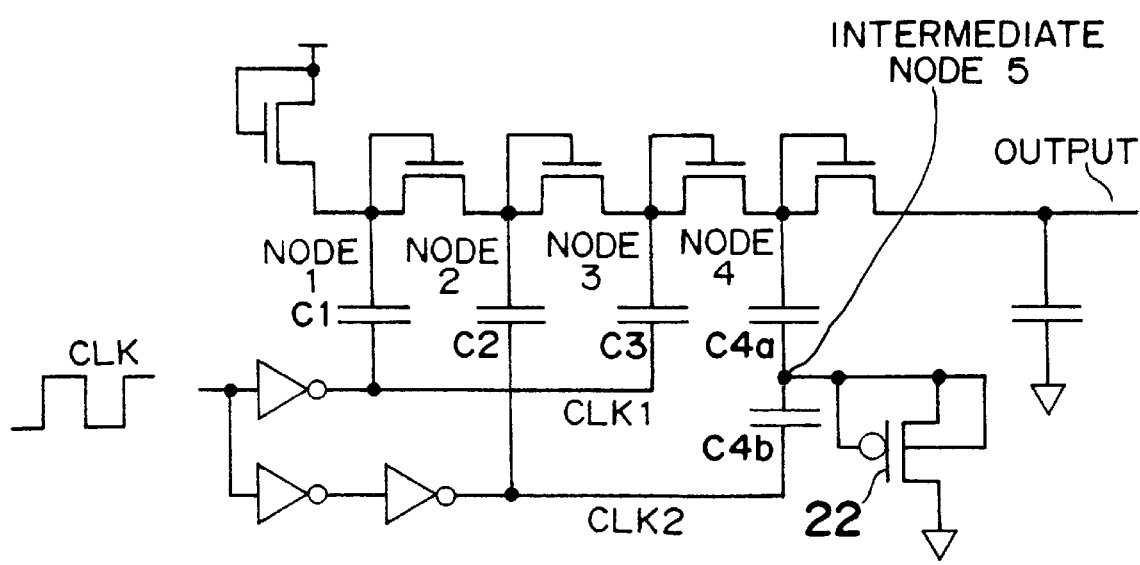
FIG. 25 is a circuit diagram of a conventional high voltage pump different from the one in FIG. 24, wherein an intermediate node between two-stage capacitors is discharged.
Figure 27:
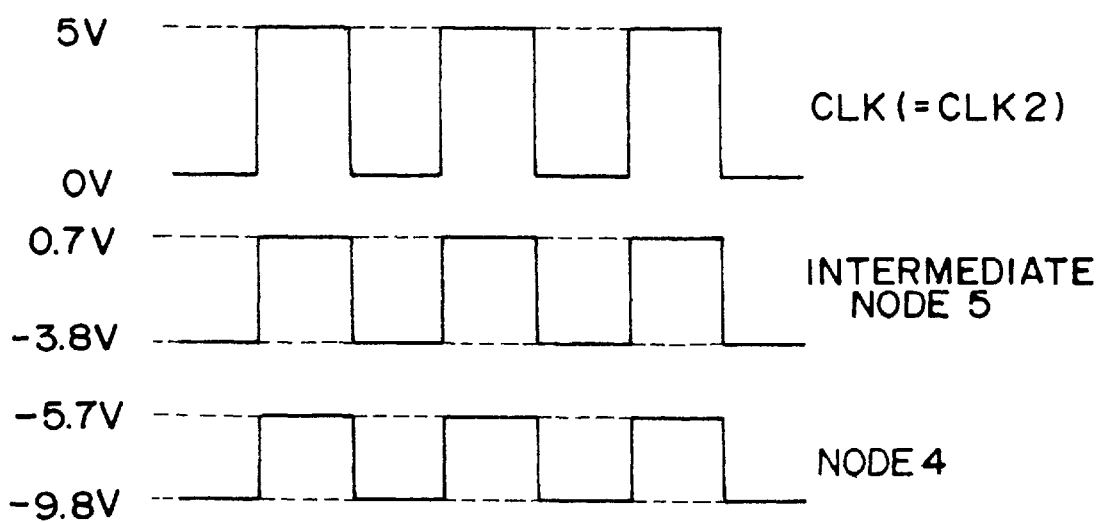
FIG. 27 shows an ideal voltage waveform of the intermediate node when the two-stage capacitor is applied to the negative voltage pump.
Figure 28:
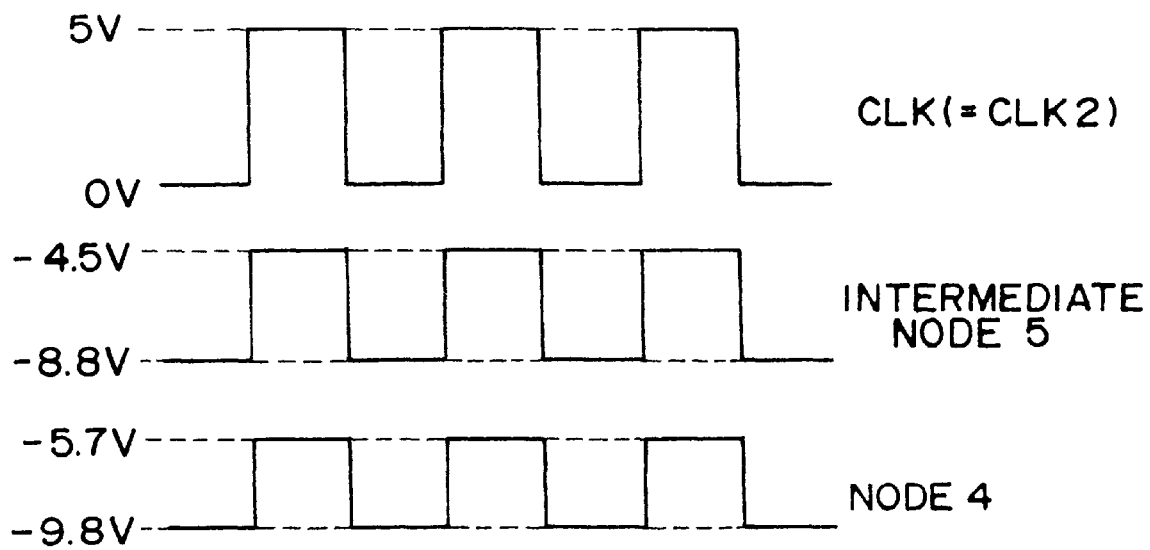
FIG. 28 shows voltage waveforms when the intermediate node is charged up to a negative voltage in the negative voltage pump to which the two-stage capacitor is applied.
Figure 29:
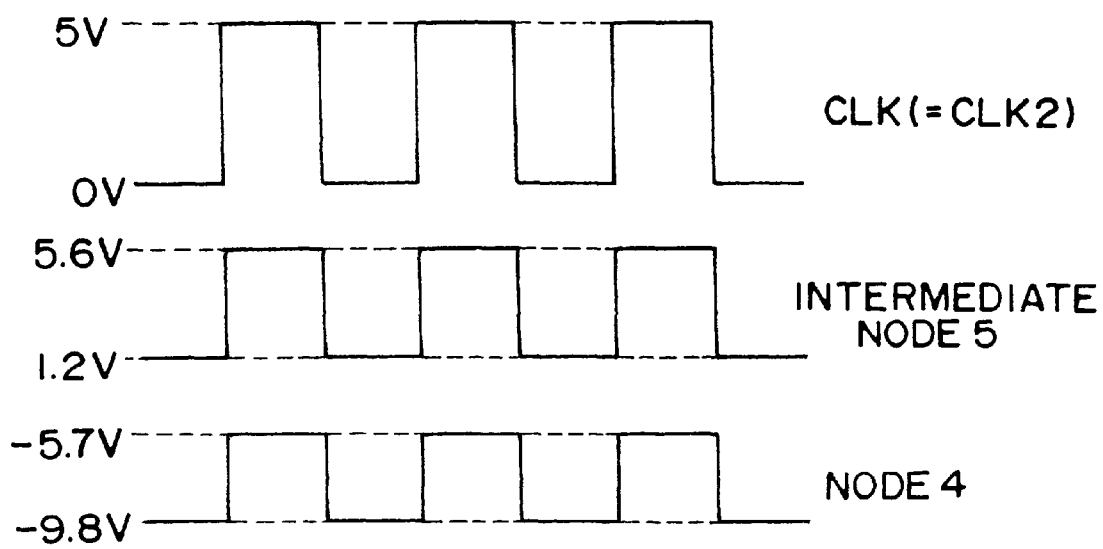
FIG. 29 shows voltage waveforms when the intermediate node is charged up to a positive voltage in the negative voltage pump to which the two-stage capacitor is applied.

Here, in the case of an ideal state, where the internal voltage of this booster circuit is 0 V in the initial state, when the average voltage of the nodes 21, 22, 23, 24 is Vcc=5V, the voltage waveforms lower with time as shown in FIG. 18. After the output becomes stable, voltage waveforms of the nodes 24, 25 become as shown in FIG. 27.

Figure 8:
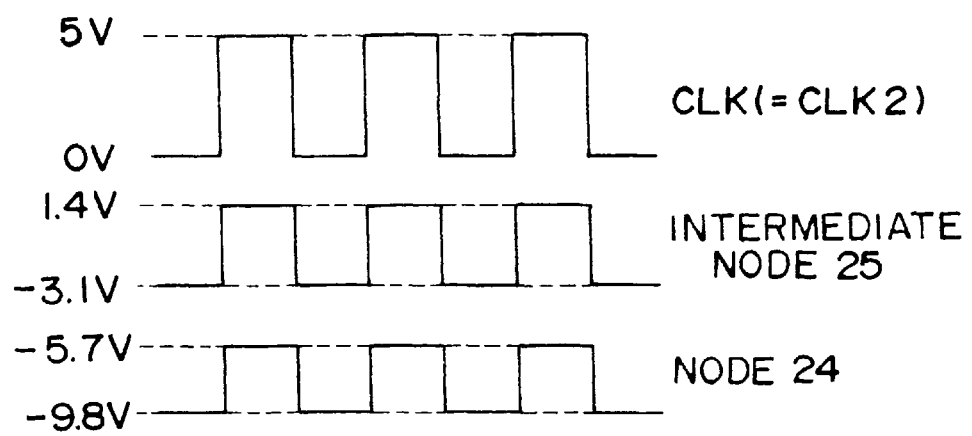
FIG. 8 shows voltage waveforms of nodes 24, 25 in FIG. 6 after an output becomes stable.

However, since the initial voltage is about 0.7 V higher when the internal voltage of this booster circuit rises about 0.7 V, the voltage waveforms of the nodes 24, 25 after the output becomes stable become as shown in FIG. 8. This suggests that the potential of the intermediate node 25 in this case is about 0.7 V higher than in the case of the ideal state in FIG. 27. This means that, when the internal voltage rises to 0.7 V or higher, the potential of the intermediate node 25 in a stable state also becomes 0.7 V higher than in the case of the ideal state.

However, in the booster circuit of this embodiment, even if a positive charge or a negative charge is charged to the intermediate node 25 in the initial state until the pump operation is started, the node is discharged by operations of an inverter 69 and the p-MOS transistor 68. Therefore, even when the potential of the intermediate node 25 is charged up in the initial state, it is only about 0.7 V and the waveforms of the nodes 24, 25 become as shown in FIG. 8.

In this case, the maximum voltage applied to the capacitors C24a, C24b constituting a two-stage capacitor is 7.1 V as shown in FIG. 8. Here, since the withstand voltage of the capacitor is 8 V, voltages applied to both ends of the capacitors C24a, C24b do not exceed the withstand voltage of the capacitor insulating film. As a result, a stable operation can be performed when the pump operation is started and a voltage applied to a capacitor does not exceed the withstand voltage of the capacitor during a normal operation. Thus, damage to the capacitor insulating film can be prevented.

As described above, the booster circuit of this embodiment is constituted by a plurality of p-MOS transistors 61 to 64 and a plurality of capacitors C21 to C24, while the capacitor C24 at the final stage is constituted by a two-stage capacitor composed of capacitors C24a, C24b. Furthermore, the drain of the p-MOS transistor 68 is connected to the intermediate node 25 between the capacitors C24a, C24b and a signal reset is inputted to the gate of the p-MOS transistor 68 via the inverter 69. Furthermore, based on the clock CLK, charges are captured from drains of the p-MOS transistors 61 to 64 to the corresponding capacitors C21 to C24 alternately. Thus, the standard voltage Vss is lowered to output a negative voltage to be used for a gate line voltage or the like during a write operation or the like.

In this case, in the initial state until a pump operation is started, the level of a signal reset of the inverter 69 is made "H" to turn on the p-MOS transistor 68. Therefore, when a positive charge is charged to the intermediate node 25, the node is discharged via the p-MOS transistor 68, while, when a negative charge is charged, the node is discharged via an N-well of the p-MOS transistor 68. Thus, the potential of the intermediate node 25 can be made about 0.7 V.

Therefore, the waveforms of nodes 24, 25 become as shown in FIG. 8 even when a pump operation is started, the level of the signal reset becomes "L" and the p-MOS transistor 68 is turned off. That is, when the maximum voltage applied to the capacitors C24a, C24b constituting a two-stage capacitor is made 7.1 V, exceeding of the withstand voltage of the capacitor insulating film can be prevented.

(Fourth Embodiment)

As described above, in the third embodiment, wherein the drain of the p-MOS transistor 68 is connected to the intermediate node 25 between the two-stage capacitors C24a, C24b at the final stage and the gate of the p-MOS transistor 68 is controlled by an output signal from the inverter 69, the intermediate node 25 may be charged up to about −0.6 V to 0.7 V in the initial state. This embodiment solves this problem.

Figure 9:
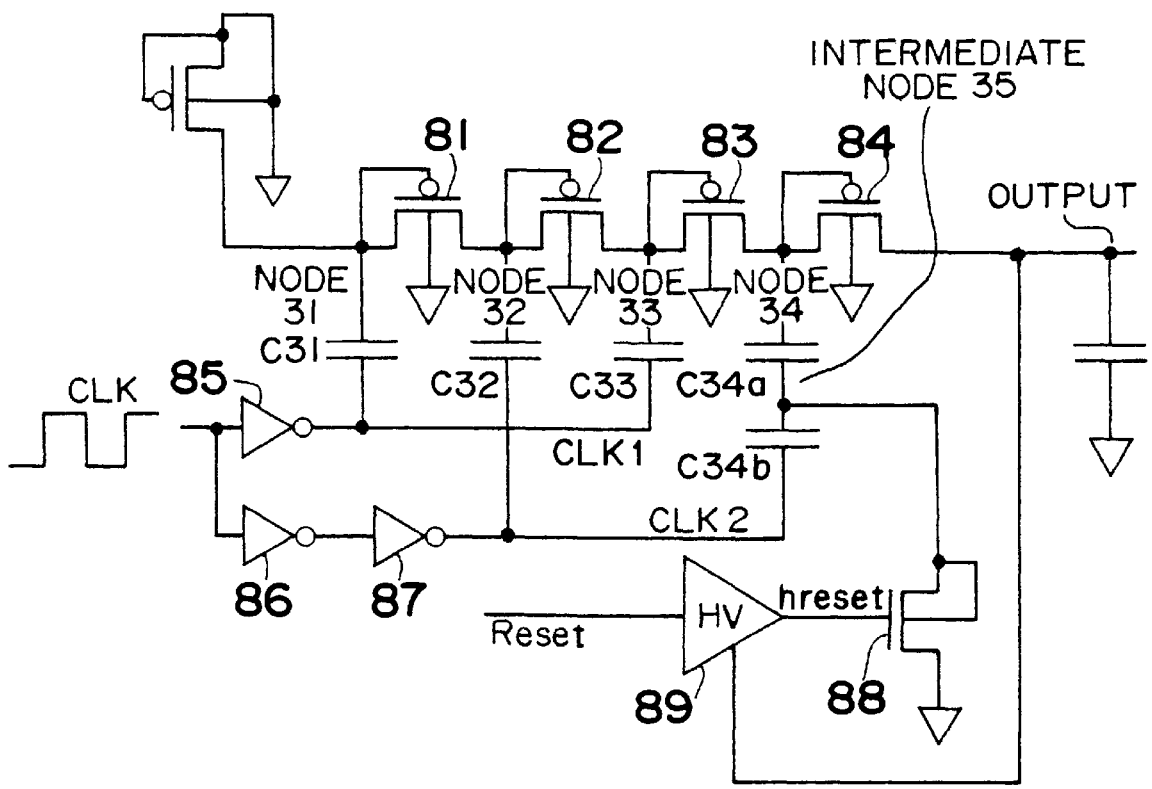
FIG. 9 is a circuit diagram of a booster circuit different from the ones in FIGS. 1, 5 and 6.

FIG. 9 is a circuit diagram of a booster circuit according to this embodiment. P-MOS transistors 81 to 84, capacitors C31 to C33, two-stage capacitors C34a, C34b and inverters 85, 86, 87 are the same as n-MOS transistors 61 to 64, capacitors C21 to C23, two-stage capacitors C24a, C24b and inverters 65, 66, 67 in the third embodiment, respectively.

Figure 10:
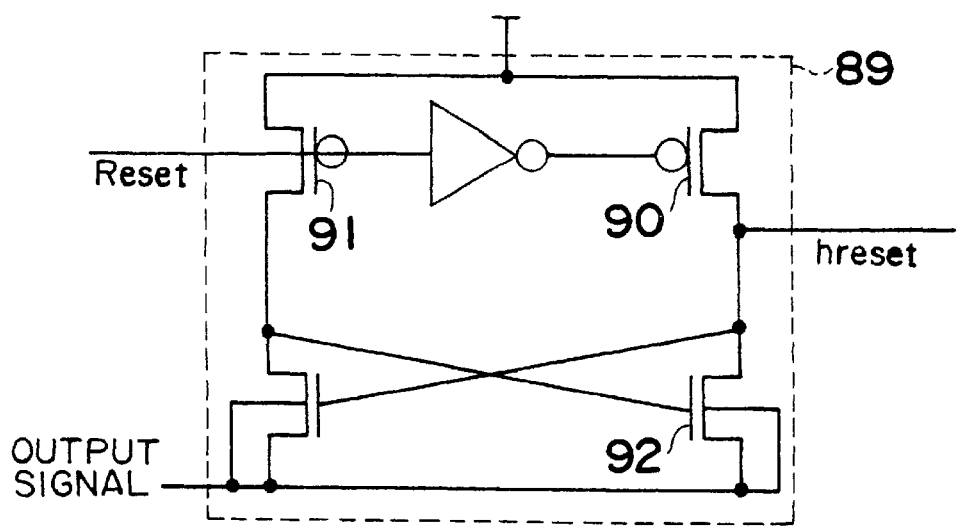
FIG. 10 shows a circuit configuration of a level shifter in FIG. 9.
Figure 11:
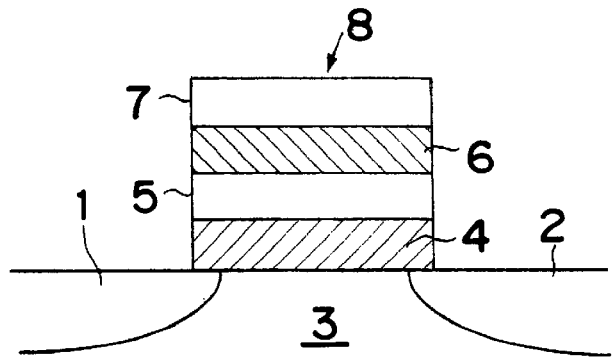
FIG. 11 is a schematic cross sectional view showing an ETOX-type flash memory cell.
Figure 12:
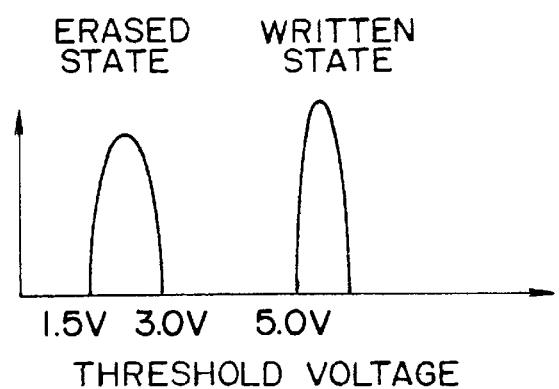
FIG. 12 shows a threshold voltage distribution in a flash memory in a written state and an erased state.
Figure 13:
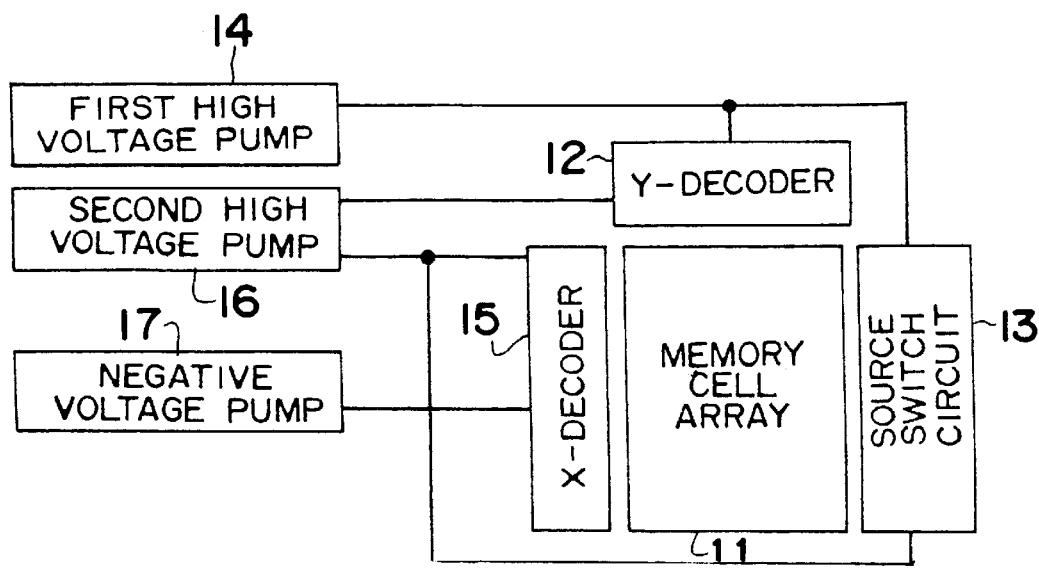
FIG. 13 is a block diagram of a voltage generation system of a nonvolatile semiconductor memory device.

In this embodiment, a drain of an n-MOS transistor 88 is connected to an intermediate node 35 between the two capacitors C34a, C34b constituting a two-stage capacitor. Then, a gate of the n-MOS transistor 88 is controlled by a level shifter 89. This level shifter 89 is a conventional negative voltage level shifter having a circuit configuration shown in FIG. 10.

The booster circuit having the above configuration operates as follows. That is, since a signal Reset to the level shifter 89 is maintained in an "H" state until a pump operation is started. In this case, since a p-MOS transistor 90 of the level shifter 89 (see FIG. 10) is turned on, a signal hreset in an "H (Vcc)" state is outputted and the n-MOS transistor 88 is turned on. Therefore, the potential of the intermediate node 35 between two-stage capacitors C34a, C34b is maintained at Vss (0 V). That is, the intermediate node 35 is not charged up.

When a pump operation is started in this state, the level of the signal Reset to the level shifter 89 becomes "L". In this case, since a p-MOS transistor 91 of the level shifter 89 (see FIG. 10) is turned on, an n-MOS transistor 92 is turned on. An output signal of this booster circuit is outputted as the signal hreset, and the n-MOS transistor 88 is turned off. Therefore, when the level of clock CLK is changed (Vcc (5 V)→0 V) immediately after the start of the pump operation, the intermediate node 35 is lowered to about −2.5 V. In this case, since the p-MOS transistor 84 is already turned off, the voltage of the intermediate node 35 is maintained at −2.5 V and, as a result, the potential of the node 34 is lowred.

Therefore, this booster circuit can perform a normal operation from immediately after a pump operation is started, and the average voltage of the nodes 31 to 34 is lowered as shown in FIG. 18 and reaches a prescribed voltage. Then, since the intermediate node 35 is not charged up in the initial operation stage even when the pump operation becomes stable, voltage waveforms of the node 34 and the intermediate node 35 become as shown in FIG. 27.

In this case, the maximum voltage applied to the capacitors C34a, C34b constituting a two-stage capacitor is 6.4 V as shown in FIG. 27. Here, since the withstand voltage of the capacitor insulating film is 8 V, voltages applied to both ends of the capacitors C34a, C34b do not exceed the withstand voltage of the capacitor insulating film. As a result, a stable operation can be performed when a pump operation is started, and the voltage applied to a capacitor does not exceed the withstand voltage of the capacitor during a normal operation. Thus, damage to the capacitor insulating film can be prevented.

As described above, in the booster circuit of this embodiment the drain of the n-MOS transistor 88 is connected to the intermediate node 35 between the two-stage capacitors C34a, C34b and an output terminal of the level shifter 89 is connected to the gate of the n-MOS transistor. Furthermore, in the initial state until a pump operation is started, the level of the signal Reset to the level shifter 89 is set at "H" to turn on the n-MOS transistor 88. Therefore, the intermediate node 35 is maintained at Vss (0 V) and is not charged up.

Therefore, even when the pump operation is started, the level of the signal Reset becomes "L" and the n-MOS transistor 88 is turned off, waveforms of the nodes 34, 35 are in an ideal state as shown in FIG. 27. That is, when the maximum voltage applied to the capacitors C34a, C34b constituting a two-stage capacitor is made 6.4 V, exceeding of the withstand voltage of the capacitor insulating film can be prevented.

The capacitor at the final stage is constituted by a two-stage capacitor in the above embodiments, but the present invention is not limited to this configuration. Three or more stages may be included.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A booster circuit of a nonvolatile semiconductor memory device having a plurality of capacitors, generating a voltage different from a power source voltage during a write operation and an erase operation and supplying the voltage to the nonvolatile semiconductor memory device, wherein among those capacitors, a capacitor to which a high electric field exceeding a withstand voltage of an insulating film constituting each capacitor is applied is constituted by two or more partial capacitors connected to each other in series; the booster circuit, comprising:
a transistor element connected between the partial capacitors; and
control means, which turns on the transistor element when the nonvolatile semiconductor memory device is in an inoperative state and turns off the transistor element when the device is in an operative state.

2. The booster circuit of a nonvolatile semiconductor memory device according to claim 1, wherein
the transistor element is a p-type metal oxide film semiconductor transistor whose source is connected to a standard voltage; and
the control means is constituted such that the standard voltage is applied to a gate of the p-type metal oxide film semiconductor transistor when the nonvolatile semiconductor memory device is in an inoperative state.

3. The booster circuit of a nonvolatile semiconductor memory device according to claim 1, wherein
the transistor element is an n-type metal oxide film semiconductor transistor whose source is connected to the standard voltage; and
the control means is constituted such that the power source voltage is applied to a gate of the n-type metal oxide film semiconductor transistor when the nonvolatile semiconductor memory device is in an inoperative state.

4. The booster circuit of a nonvolatile semiconductor memory device according to claim 1, wherein
at least the partial capacitor has a structure including polysilicon, an insulating film and polysilicon laminated in this order.

5. The booster circuit of a nonvolatile semiconductor memory device according to claim 1, wherein
the voltage different from the power source voltage is a high voltage higher than the power source voltage.

6. The booster circuit of a nonvolatile semiconductor memory device according to claim 1, wherein
the voltage different from the power source voltage is a negative voltage.

* * * * *